(12) United States Patent
Lee et al.

(10) Patent No.: US 12,068,141 B2
(45) Date of Patent: Aug. 20, 2024

(54) RING ASSEMBLY, SUBSTRATE SUPPORT APPARATUS AND PLASMA PROCESSING APPARATUS INCLUDING THE SAME

(71) Applicant: SAMSUNG ELECTRONICS CO., LTD., Suwon-si (KR)

(72) Inventors: Sungki Lee, Hwaseong-si (KR); Jonggun Yoon, Seoul (KR); Sungkyu Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 125 days.

(21) Appl. No.: 17/969,379

(22) Filed: Oct. 19, 2022

(65) Prior Publication Data

US 2023/0197419 A1  Jun. 22, 2023

(30) Foreign Application Priority Data

Dec. 21, 2021 (KR) ........................ 10-2021-0183842

(51) Int. Cl.
*H01J 37/32* (2006.01)
*H01L 21/68* (2006.01)
*H01L 21/687* (2006.01)

(52) U.S. Cl.
CPC .. *H01J 37/32642* (2013.01); *H01L 21/68742* (2013.01)

(58) Field of Classification Search
CPC .......... H01J 37/32623; H01J 37/32642; H01J 37/32715; H01J 37/32724; H01L 21/67109; H01L 21/6831; H01L 21/68735; H01L 21/68742

See application file for complete search history.

(56) References Cited

U.S. PATENT DOCUMENTS

| | | | |
|---|---|---|---|
| 6,117,349 A * | 9/2000 | Huang | H01J 37/32431 438/729 |
| 6,344,105 B1 | 2/2002 | Daugherty et al. | |
| 7,658,816 B2 | 2/2010 | Koshiishi et al. | |
| 9,490,166 B2 | 11/2016 | Rieschl et al. | |
| 9,997,381 B2 | 6/2018 | McMillin et al. | |

(Continued)

FOREIGN PATENT DOCUMENTS

| | | |
|---|---|---|
| JP | 2016-40800 A | 3/2016 |
| KR | 10-2014-0005147 A | 1/2014 |

(Continued)

*Primary Examiner* — Tung X Le
(74) *Attorney, Agent, or Firm* — Sughrue Mion, PLLC

(57) ABSTRACT

A ring assembly includes: an outer insulating ring on an upper outer periphery of a substrate stage; an edge ring on the outer insulating ring around a wafer seated on the substrate stage; and a shadow ring on the outer insulating ring and the edge ring to be movable up and down within a predetermined stroke range and to cover an edge region of the wafer. An upper surface of the edge ring is located higher than an upper surface of the wafer by a predetermined height. The shadow ring includes an annular body portion, and a recess in a bottom surface of the body portion to receive at least a portion of a protruding upper portion of the edge ring. The shadow ring is spaced apart from the outer insulating ring and the edge ring by a predetermined distance to form a flow path for gas flow therebetween.

20 Claims, 16 Drawing Sheets

(56) References Cited

U.S. PATENT DOCUMENTS

| | | | |
|---|---|---|---|
| 10,170,277 B2 | 1/2019 | Singh et al. | |
| 10,199,252 B2 * | 2/2019 | Chiu | H01L 21/6833 |
| 10,217,617 B2 * | 2/2019 | Okita | H01L 21/6836 |
| 10,388,559 B2 | 8/2019 | Rieschl et al. | |
| 10,790,123 B2 | 9/2020 | Sarode Vishwanath | |
| 10,903,055 B2 | 1/2021 | Mishra et al. | |
| 11,049,756 B2 * | 6/2021 | Chiu | H01L 21/823431 |
| 2011/0159211 A1 * | 6/2011 | Du Bois | C23C 14/04 |
| | | | 118/71 |
| 2019/0096634 A1 | 3/2019 | Singh et al. | |

FOREIGN PATENT DOCUMENTS

| | | |
|---|---|---|
| KR | 10-2018-0099776 A | 9/2018 |
| KR | 10-1963862 B1 | 3/2019 |
| KR | 10-2077975 B1 | 2/2020 |
| KR | 10-2208209 B1 | 1/2021 |

* cited by examiner

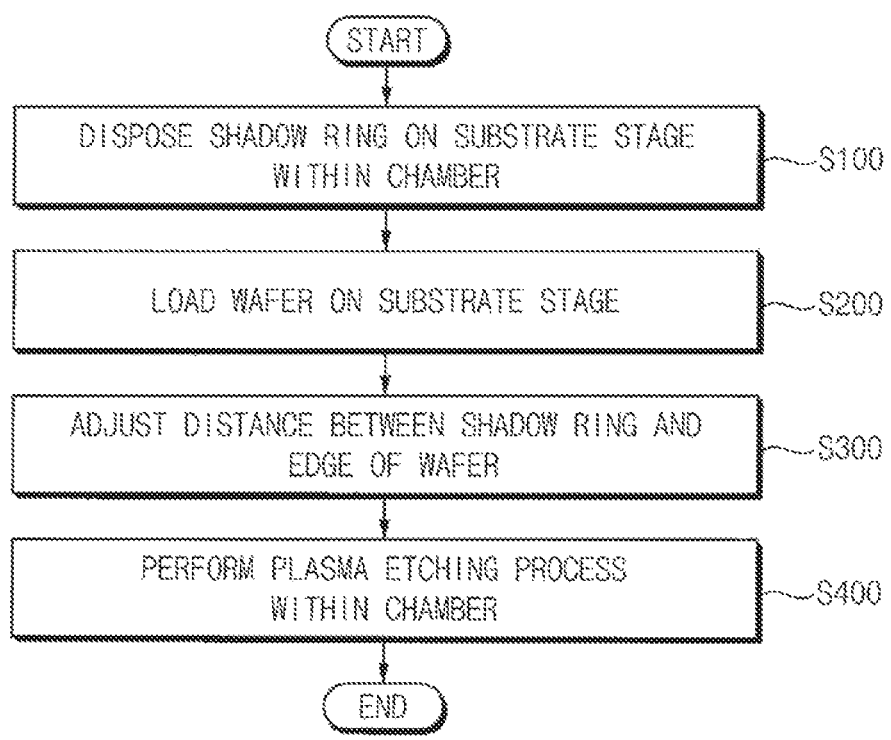

RING ASSEMBLY, SUBSTRATE SUPPORT APPARATUS AND PLASMA PROCESSING APPARATUS INCLUDING THE SAME

CROSS-REFERENCE TO THE RELATED APPLICATION

This application claims priority under 35 U.S.C. § 119 to Korean Patent Application No. 10-2021-0183842, filed on Dec. 21, 2021 in the Korean Intellectual Property Office (KIPO), the contents of which are herein incorporated by reference in their entirety.

BACKGROUND

1. Field

Example embodiments of the present disclosure relate to a ring assembly, a substrate support apparatus, and a plasma processing apparatus including the same. More particularly, example embodiments of the present disclosure relate to a ring assembly having a shadow ring for protecting an edge region of a wafer, a substrate support apparatus, and a plasma processing apparatus including the same.

2. Description of Related Art

In an etching process using plasma, for example, an etching process for forming a through silicon via (TSV), a shadow ring may be disposed on an outer peripheral region of a substrate stage to protect an edge region of a wafer. In order to avoid interference with the wafer during loading and unloading of the wafer, the shadow ring may be installed to be movable up and down between predetermined vertical positions. However, since the shadow ring limits only an amount of radicals, etching in the edge region due to ion collision may not be considered, and there is a limitation in that it cannot cope with changes in time and process characteristics in real time.

SUMMARY

Example embodiments of the present disclosure provide a ring assembly capable of controlling an etch rate in an edge region of a wafer during a plasma etching process.

Example embodiments of the present disclosure provide a substrate support apparatus including the ring assembly.

Example embodiments of the present disclosure provide a plasma processing apparatus including the substrate support apparatus.

According to example embodiments of the present disclosure, a ring assembly is provided. The ring assembly includes: an outer insulating ring on an upper outer periphery of a substrate stage, the substrate stage configured to have a wafer seated thereon; an edge ring on the outer insulating ring, around the substrate stage; and a shadow ring above the outer insulating ring and the edge ring, the shadow ring configured to move up and down within a predetermined stroke range and to cover an edge region of the wafer while the wafer is seated on the substrate stage. An upper surface of the edge ring is located higher than an upper surface of the substrate stage by a predetermined height. The shadow ring includes: an annular body portion; an inner end portion extending around an inner circumference of the annular body portion and extending toward a center of the shadow ring, such as to be configured to cover the edge region of the wafer; an outer end portion extending around an outer circumference of the annular body portion; and a recess in a bottom surface of the annular body portion, at least a portion of a protruding upper portion of the edge ring received in the recess. The shadow ring is configured to move up and down such as to be spaced apart from the outer insulating ring and the edge ring by respective predetermined distances to form a flow path for gas flow between the shadow ring and the outer insulating ring and between the shadow ring and the edge ring.

According to example embodiments of the present disclosure, a substrate support apparatus is provided. The substrate support apparatus includes: a substrate stage configured to have a wafer seated thereon; and a ring assembly configured to control plasma in an edge region of the wafer. The ring assembly includes: an outer insulating ring around an upper outer periphery of the substrate stage; an edge ring around the substrate stage, and on the outer insulating ring; and a shadow ring configured to move up and down within a predetermined stroke range above the outer insulating ring and the edge ring, the shadow ring configured to cover the edge region of the wafer while the wafer is seated on the substrate stage. The upper surface of the edge ring is located higher than an upper surface of the substrate stage by a predetermined height. The shadow ring includes: a body portion including an annular shape; and a recess in a bottom surface of the body portion, the recess configured to accommodate at least a portion of a protruding upper portion of the edge ring.

According to example embodiments of the present disclosure, a plasma processing apparatus is provided. The plasma processing apparatus includes: a chamber including a space for processing a wafer; a substrate stage disposed within the chamber, the substrate stage configured to have the wafer seated thereon; a plasma electrode configured to generate plasma within the chamber based on plasma power being supplied to the plasma electrode; an outer insulating ring around an upper outer periphery of the substrate stage; an edge ring around the substrate stage and on the outer insulating ring; and a shadow ring configured to move up and down within a predetermined stroke range above the outer insulating ring and the edge ring, the shadow ring configured to cover an edge region of the wafer while the wafer is seated on the substrate stage. An upper surface of the edge ring is located higher than an upper surface of the substrate stage by a predetermined height. The shadow ring includes: a body portion including an annular shape; and a recess in a bottom surface of the body portion, the recess accommodating at least a portion of a protruding upper portion of the edge ring.

According to example embodiments of the present disclosure, a ring assembly may include an outer insulating ring disposed around an upper outer periphery of a substrate stage, an edge ring disposed around the wafer on the outer insulating ring, and a shadow ring installed to be movable up and down within a predetermined stroke range on the outer insulating ring and the edge ring, the shadow ring being supported to cover an edge region of the wafer.

By adjusting a distance between the shadow ring and the outer insulating ring and a distance between the shadow ring and the edge ring, a flow conductance in a flow path therebetween may be adjusted. Further, since an upper surface of the edge ring is located higher than the upper surface of the wafer, an ion incident direction on the edge surface of the wafer may be formed to deviate from the wafer to thereby reduce an amount of etching in the edge region of wafer.

Thus, the distance of the shadow ring may be adjusted to actively cope with etch rate changes due to process changes in a post process.

BRIEF DESCRIPTION OF THE DRAWINGS

Example embodiments of the present disclosure will be more clearly understood from the following detailed description taken in conjunction with the accompanying drawings. FIGS. 1 to 15 represent non-limiting, example embodiments as described herein.

FIG. 1 is a block diagram illustrating a plasma processing apparatus in accordance with example embodiments.

FIG. 2 is a taken along the line II-IF in FIG. 1.

FIG. 3 is a cross-sectional view illustrating a portion of a substrate support apparatus.

FIG. 4 is a partial perspective view illustrating a portion of a shadow ring in FIG. 3.

FIG. 5 is a cross-sectional view illustrating the shadow ring in FIG. 4.

FIG. 6 is a cross-sectional view illustrating a state in which the shadow ring is raised in FIG. 3.

FIG. 7 is a cross-sectional view illustrating a portion of a lift pin device in accordance with example embodiments.

FIG. 8 is a cross-sectional view illustrating a state in which a lift pin is lowered in FIG. 7.

FIG. 9 is a perspective view illustrating a lower cover of a substrate stage in FIG. 1.

FIG. 10 is a perspective view illustrating a drive motor of a lift pin in FIG. 7.

FIG. 11 is a block diagram illustrating a controller coupled to a drive mechanism of lift pins in accordance with example embodiments.

FIG. 13 is a cross-sectional view illustrating a flow of gas flowing between the shadow ring and an underlying outer insulating ring and an underlying edge ring, and directions of ions incident onto an edge region of a wafer.

FIG. 14 is a graph showing an etch rate distribution according to a distance of a shadow ring with respect to a wafer surface.

FIG. 15 is a flow chart illustrating a substrate processing method in accordance with example embodiments.

DETAILED DESCRIPTION

Hereinafter, example embodiments of the present disclosure will be explained in detail with reference to the accompanying drawings.

Figure 1:
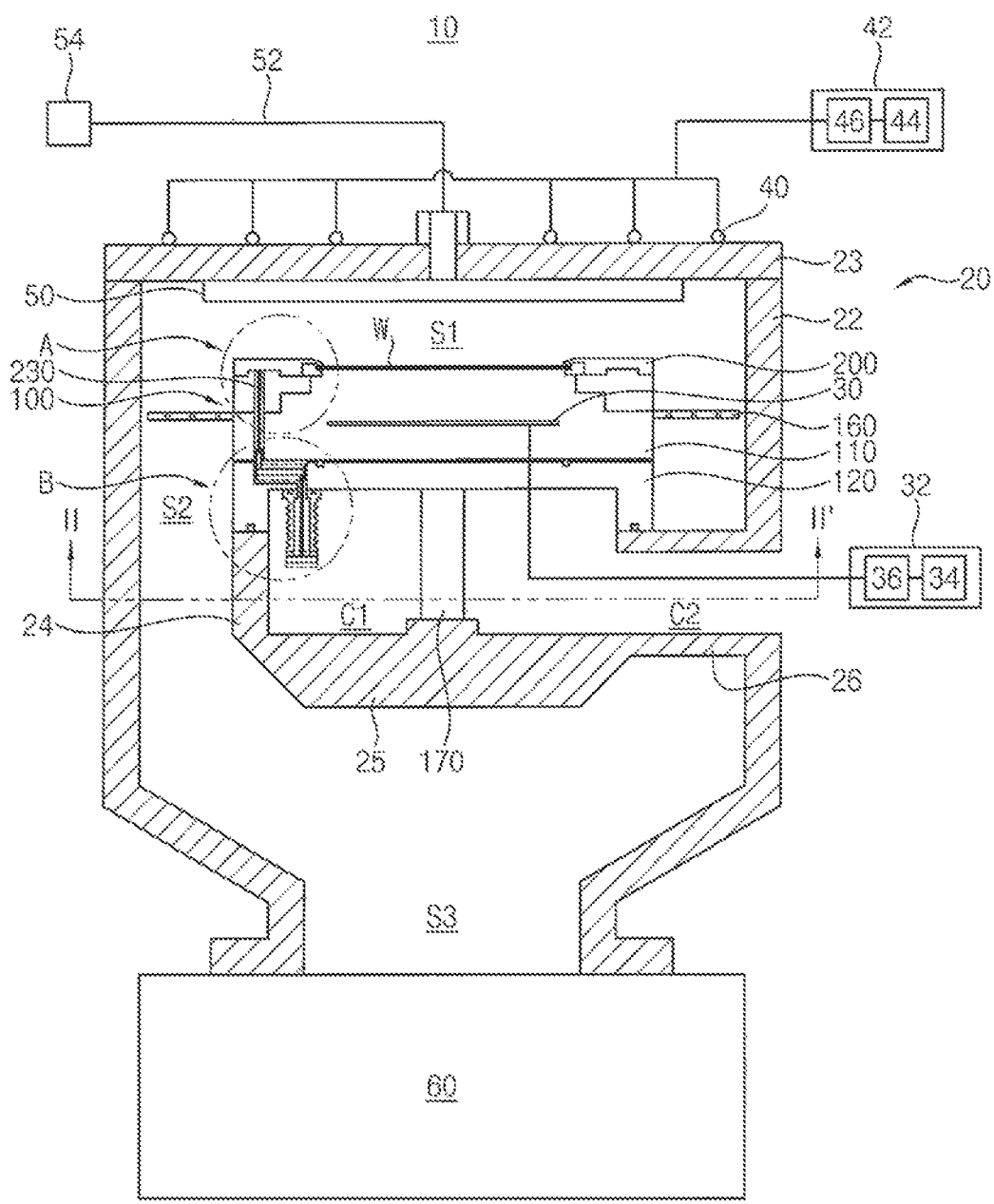
Figure 2:
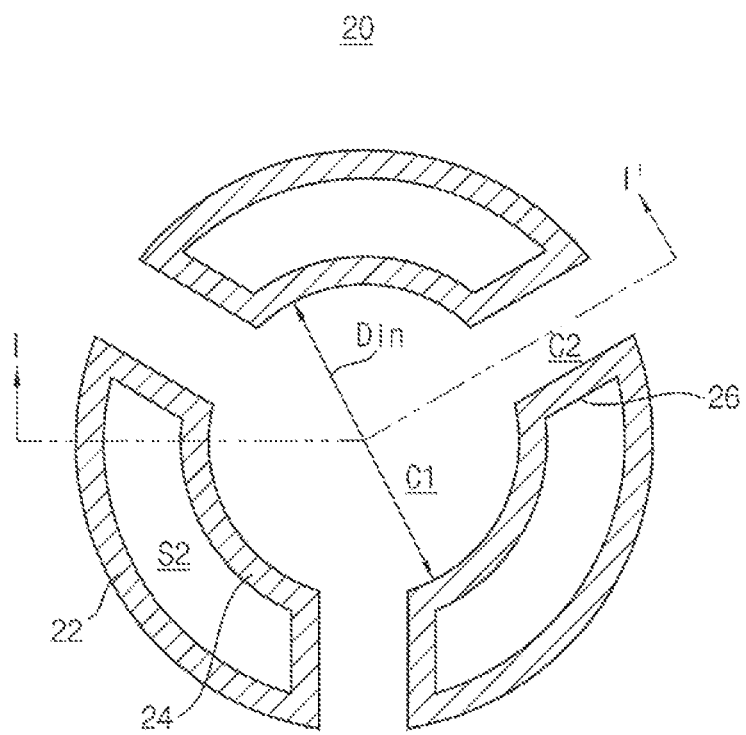

FIG. 1 is a block diagram illustrating a plasma processing apparatus in accordance with example embodiments. FIG. 2 is a taken along the line II-IF in FIG. 1. FIG. 1 is a longitudinal cross-sectional view taken along the line I-I' in FIG. 2.

Referring to FIGS. 1 and 2, a plasma processing apparatus 10 may include a chamber 20 and a substrate support apparatus disposed in the chamber 20 to support a substrate such as a wafer W. The substrate support apparatus may include a substrate stage 100 on which the wafer W is mounted and a ring assembly configured to control plasma in an edge region of the wafer W. As will be described later, the ring assembly may include an outer insulating ring disposed around the substrate stage 100, an edge ring disposed around the wafer W, and a shadow ring 200 installed to be movable up and down on the edge ring and covering the edge region of the wafer W. In addition, the plasma processing apparatus 10 may further include a plasma power supply, a bias power supply, a gas supply, an exhaust portion 60, etc.

In example embodiments, the plasma processing apparatus 10 may be an apparatus configured to etch a layer on the substrate using plasma. The plasma processing apparatus 10 may be an apparatus configured to etch a target layer to be etched on the substrate such as a semiconductor wafer W disposed within an induced coupled plasma (ICP) chamber 20. However, the plasma generated by the plasma processing apparatus may not be limited to inductively coupled plasma, and for example, capacitively coupled plasma or microwave plasma may be generated. In addition, the plasma processing apparatus may not be necessarily limited to an etching apparatus, and may be used, for example, as a deposition apparatus or a cleaning apparatus. Here, the substrate may include a semiconductor substrate, a glass substrate, or the like.

The chamber 20 may provide an enclosed space for performing a plasma etching process on the wafer W. The chamber 20 may be a cylindrical vacuum chamber. The chamber 20 may include a metal such as aluminum or stainless steel. The chamber 20 may include a cover 23 covering an upper portion of the chamber 20. The cover 23 may seal the upper portion of the chamber 20. The cover 23 may include a dielectric window.

As illustrated in FIGS. 1 and 2, the chamber 20 may include a cylindrical outer side wall 22 and a cylindrical inner side wall 24 disposed within the cylindrical outer side wall 22. The substrate stage 100 may be installed on an upper end of the cylindrical inner side wall 24.

A first internal space S1 may be defined between the substrate stage 100 and the cover 23 inside an upper portion of the cylindrical outer side wall 22. As will be described later, plasma may be formed in the first internal space S1.

A second inner space S2 may be defined between a middle portion of the cylindrical outer side wall 22 and the cylindrical inner side wall 24. The second internal space S2 may be provided on an outer surface and a lower portion of the substrate stage 100 and may be in communication with the first internal space S1.

A third inner space S3 may be defined inside a lower portion of the cylindrical outer side wall 22 to be in communication with the second inner space S2. The third internal space S3 may serve as an exhaust port. Accordingly, process byproducts and residual process gases generated in the first internal space S1 may be exhausted to the outside through the third internal space S3 via the second internal space S2.

The chamber 20 may include an inner lower wall 25 that covers a lower portion of the cylindrical inner side wall 24. The inner lower wall 25 may include a disk-shaped plate. The cylindrical inner side wall 24 may extend upward from an outer region of the inner lower wall 25 to define a first accommodation space C1 under the substrate stage 100. An actuator for elevating lift pins for a shadow ring and an actuator for elevating lift pins for the wafer may be installed in the first accommodation space C1. The substrate stage 100 may be supported on the inner lower wall 25 by a support shaft 170.

The chamber 20 may include a connection side wall 26 extending from the cylindrical outer side wall 22 to the cylindrical inner side wall 24. The connection side wall 26 may define a second accommodation space C2 in communication with the first accommodation space C1. The second accommodation space C2 may be opened to the outside so that the first accommodation space C1 and the second accommodation space C2 may be maintained at atmospheric pressure. The second accommodation space C2 may be used as a connection passage in which the support shaft 170 (also may referred to as a "drive shaft") installed in the first accommodation space C1, cables for connection to the actuators, etc., ball screws, gas pipes, etc., are installed.

In example embodiments, the substrate stage 100 may be installed in the cylindrical inner side wall 24 within the cylindrical outer side wall 22 to support the wafer W. The substrate stage 100 may include a substrate heater therein. The substrate stage 100 may be provided as an electrostatic chuck configured to hold the wafer W thereon using electrostatic force. The substrate stage 100 may include a support plate 110 and a lower cover 120.

The support plate 110 may be positioned in an upper portion of the substrate stage 100. The support plate 110 may include an electrostatic electrode (not illustrated) therein. The electrostatic electrode may be electrically connected to a DC power source (not illustrated) via an ON-OFF switch. When the switch is turned ON, the electrostatic electrode may apply the electrostatic force to the wafer W on the support plate 110, and thus, the wafer W may be held on the support plate 110 by the electrostatic force.

The lower cover 120 may be positioned in a lower portion of the substrate stage 100. An outer extension portion of the lower cover 120 may extend downward to define a space under the lower cover 120. The outer extension portion of the lower cover 120 may be fixedly supported on the upper end of the cylindrical inner side wall 24. An upper surface of the lower cover 120 may face a lower surface of the support plate 110. A drive mechanism including the actuator for moving lift pins 230 in a vertical direction may be disposed within the space of the lower cover 120.

Although it is not illustrated in the figures, the support plate 110 may include a heater and a plurality of flow paths formed therein. The heater may be electrically connected to a power source to heat the wafer W through the support plate 110. The heater may include a spiral-shaped coil. The flow path may be provided as a channel through which a heat transfer fluid circulates. The flow path may be formed in a spiral shape inside the support plate 110.

In example embodiments, a plasma power supply may include a first power supply 42 to apply a plasma source power to an upper electrode 40. For example, the first power supply 42 may include a source radio frequency (RF) power source 44 and a source RF matcher 46 as plasma source elements. The source RF power source 44 may generate a RF signal. The upper electrode 40 may include a coil having a spiral shape or a concentric shape. The source RF matcher 46 may match impedance of the RF signal generated from the source RF power source 44 to control the plasma to be generated using the coils.

The plasma power supply may include a second power supply 32 to apply a bias source power to a lower electrode 30 in the substrate stage 100. For example, the second power supply 32 may include a bias RF power source 34 and a bias RF matcher 36 as bias elements. The lower electrode 30 may attract plasma atoms or ions generated in the chamber 20. The bias RF power source 34 may generate an RF signal. The bias RF matcher 36 may adjust a bias voltage and a bias current applied to the lower electrode 30 to match impedance of bias RF. The bias RF power source 34 and the source RF power source 44 may be synchronized with each other or out of synchronization with each other through a tuner of a controller.

The controller may be connected to the first power supply 42 and the second power supply 32 to control their operations. The controller may include a microcomputer and various interfaces, and may control operations of the plasma processing apparatus according to program and recipe information stored in an external memory or an internal memory.

The gas supply may include a shower head 50, a gas supply pipe 52, and a gas supply source 54. The gas supply may supply different process gases into the chamber 20.

When a radio frequency power having a predetermined frequency (for example, 13.56 MHz) is applied to the upper electrode 40, an electromagnetic field induced by the upper electrode 40 may be applied to a source gas supplied into the chamber 20 to generate plasma. When the bias power is applied to the lower electrode, the support plate 110 may attract plasma atoms or ion generated within the chamber 20.

The exhaust portion 60 may include an exhaust line connected to the exhaust port formed in a bottom of the chamber 20. The exhaust portion 60 may include a vacuum pump to control a pressure of the chamber such that the processing space inside the chamber 20 may be depressurized to a desired vacuum level. Process by-products and residual process gases formed during a process may be discharged through the exhaust line.

In example embodiments, the plasma processing apparatus 10 may perform a plasma etching process to form through electrodes such as through silicon vias (TSVs) or an electrode pattern in the wafer W in a back end of line (BEOL).

In particular, after the wafer W in which semiconductor chips are formed is bonded on a carrier wafer of a substrate support system, a backside of the wafer W may be ground and thinned to a thickness of 50 μm or less. When a plasma etching process is performed on the wafer W having such a thin thickness, over-etching in the edge region of the wafer W may cause chipping or defects in a following chemical mechanical polishing (CMP) process. In order to prevent such over-etching, the substrate support apparatus may include the ring assembly configured to control plasma in the edge region of the wafer W. As will be described later, the ring assembly may reduce an amount of radicals in the edge region of the wafer W and change an electric field around the wafer to prevent the over-etching in the edge region due to ion collision.

Hereinafter, the ring assembly and the substrate support apparatus will be explained.

Figure 3:
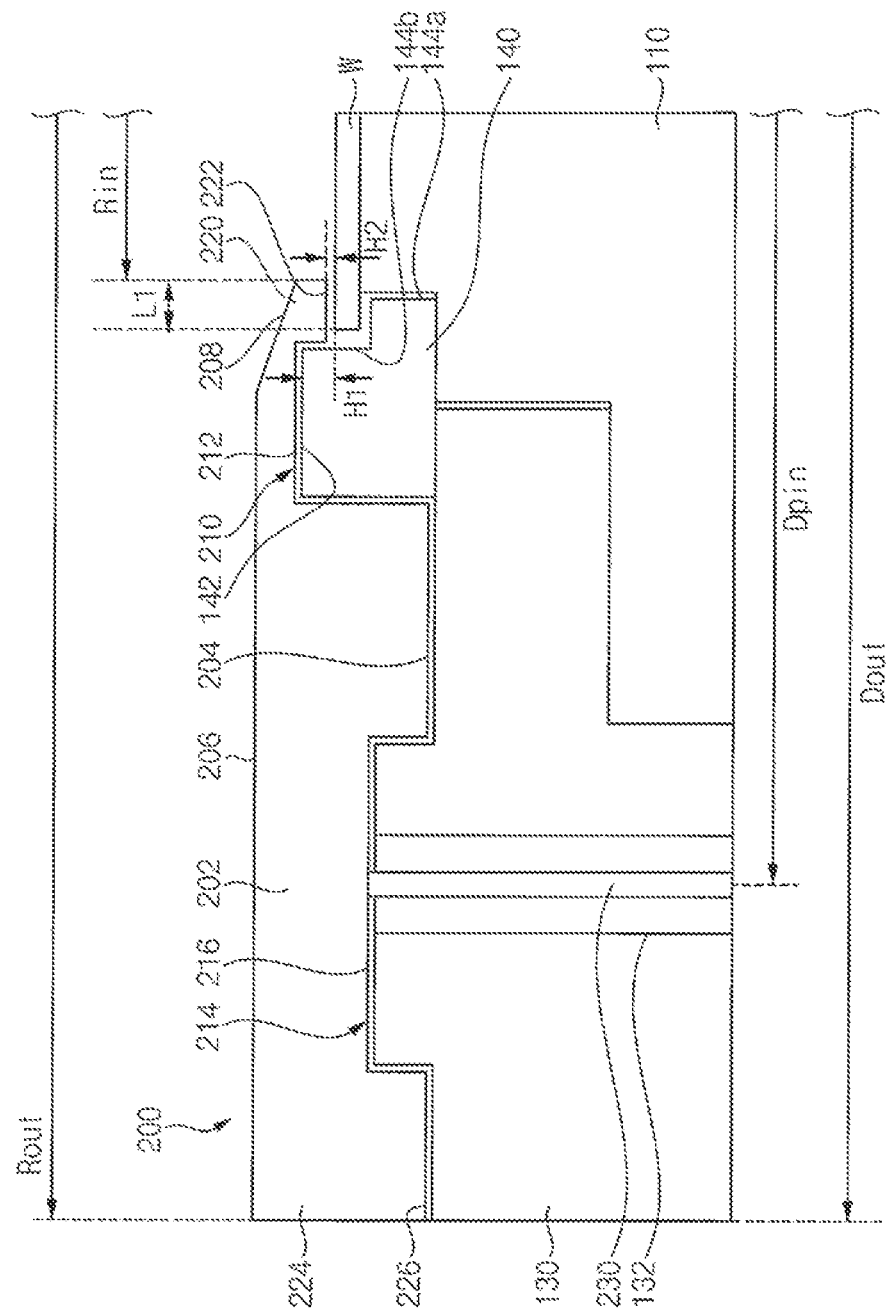
Figure 4:
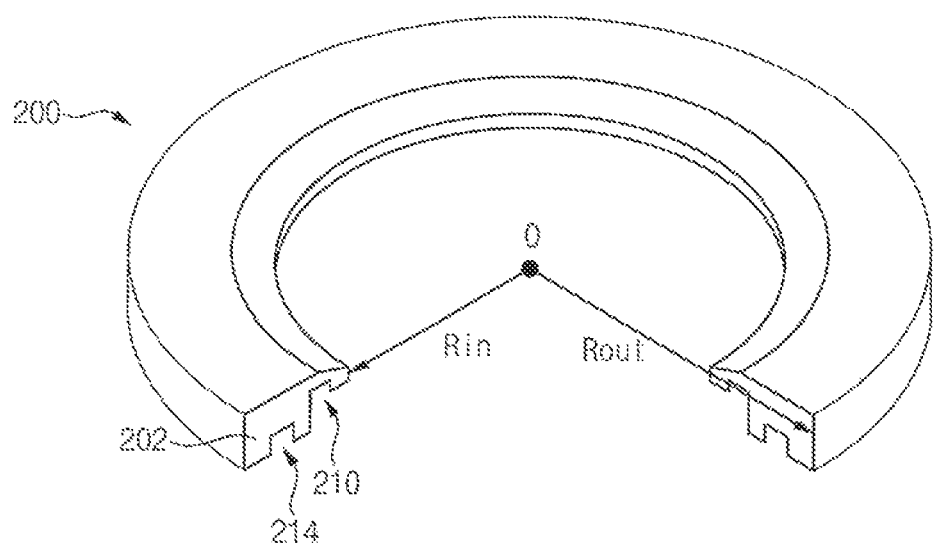
Figure 5:
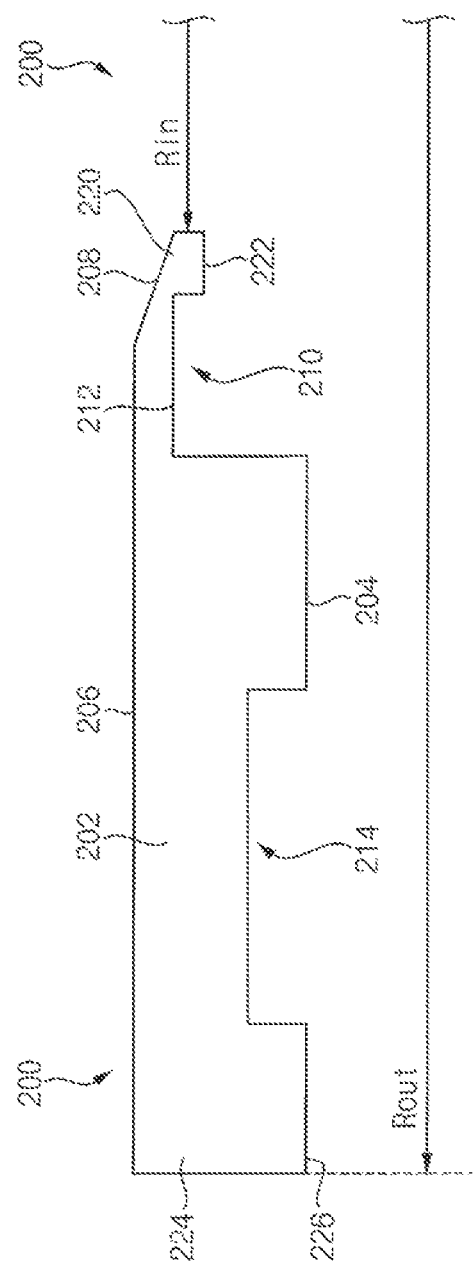
Figure 6:
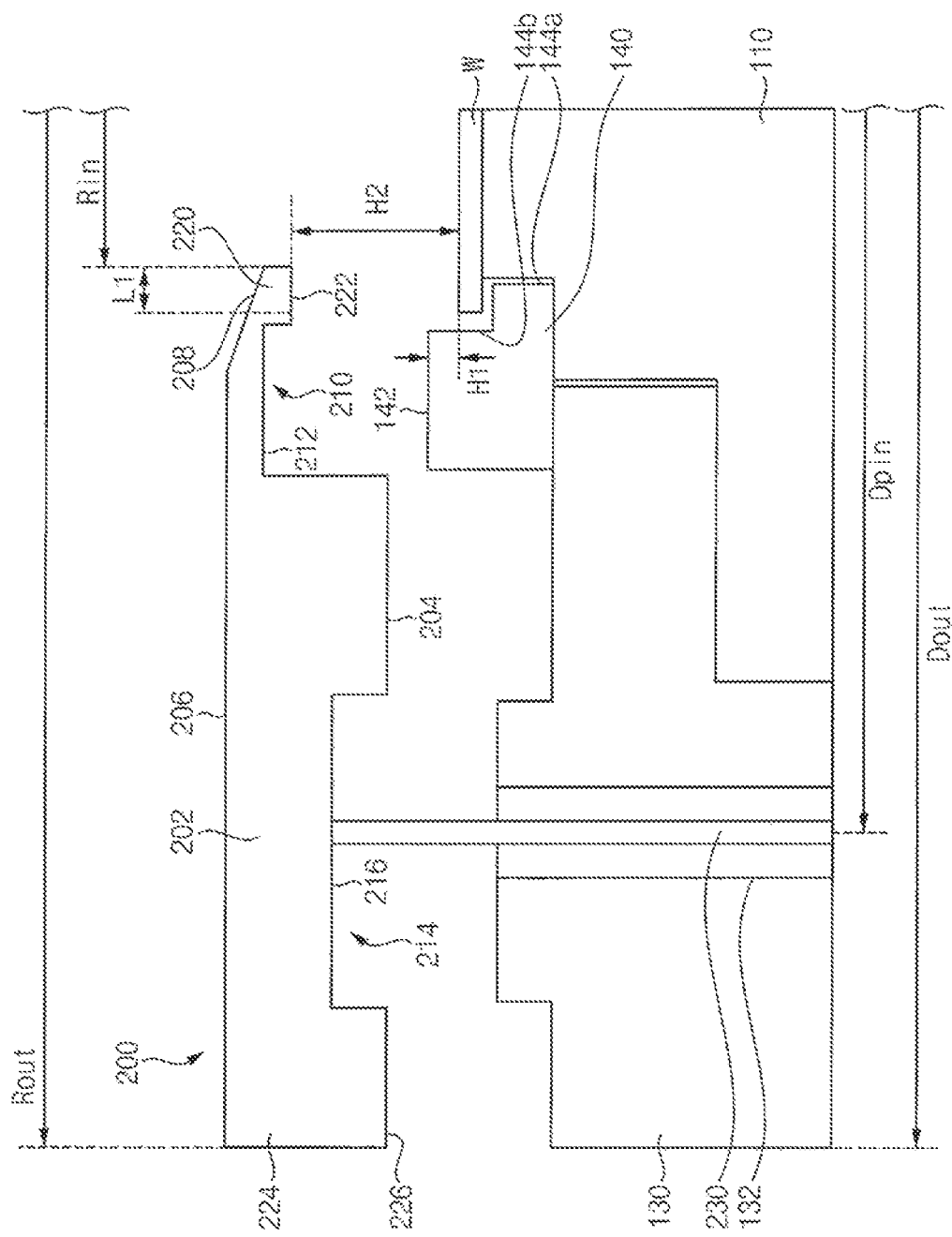

FIG. 3 is a cross-sectional view illustrating a portion of a substrate support apparatus. FIG. 4 is a partial perspective view illustrating a portion of a shadow ring in FIG. 3. FIG. 5 is a cross-sectional view illustrating the shadow ring in FIG. 4. FIG. 6 is a cross-sectional view illustrating a state in which the shadow ring is raised in FIG. 3. FIG. 3 is a cross-sectional view illustrating the a portion 'A' of FIG. 1.

Referring to FIGS. 3 to 6, the substrate support apparatus may include the substrate stage 100 (refer to FIG. 1) on which the wafer W is mounted and the ring assembly configured to control plasma in an edge region of the wafer W. The ring assembly may include an outer insulating ring 130 disposed on an outer periphery of the substrate stage 100, an edge ring 140 disposed around the wafer W on the outer insulating ring 130, and a shadow ring 200 installed on the edge ring 140 to be movable up and down and covering the edge region of the wafer W that is disposed on the substrate stage 100.

In example embodiments, the outer insulating ring 130 may be disposed to cover an upper outer circumferential surface of the support plate 110. The outer insulating ring 130 may serve as a cover ring that protects the outer surface of the support plate 110. The edge ring 140 may be disposed on the outer insulating ring 130 to surround the wafer W. The edge ring 140 may accurately seat the wafer W and control an electric field around the wafer W. The edge ring 140 may serve as a focus ring to intensively supply plasma to the wafer W. The outer insulating ring 130 and the edge ring 140 may include a ceramic material such as alumina ($Al_2O_3$), silicon carbide (SiC), yttria ($Y_2O_3$), etc.

The edge ring 140 may be disposed on the outer insulating ring 130 and may have an upper surface 142 higher than an upper surface of the wafer W. The edge ring 140 may cover an inner region of an upper surface of the outer insulating ring 130. Alternatively, the edge ring 140 may cover the entire region of the upper surface of the outer insulating ring 130. When the edge ring 140 covers the entire region of the upper surface of the outer insulating ring 130, the edge ring 140 may include a third pin hole through which one of the lift pins 230 moves upward and downward. The one of the lift pins 230 may protrude through the third pin hole of the edge ring to contact and support a lower surface 216 of the shadow ring 200.

The upper surface 142 of the edge ring 140 may have a first height H1 from the upper surface of the wafer W. For example, the first height H1 may be within a range of 3 mm to 10 mm. Since the upper surface 142 of the edge ring 140 is positioned higher than the upper surface of the wafer W, an ion incident direction to the edge surface of the wafer W may be formed to deviate from the wafer W.

A lower inner end portion 144a of the edge ring 140 may be provided under the wafer W to surround the support plate 110. When viewed in a plan view, the lower inner end portion 144a may overlap a portion of the edge region of the wafer W. An inner diameter of the lower inner end portion 144a may be smaller than an outer diameter of the wafer W. A difference between the inner diameter of the lower inner end portion 144a and the outer diameter of the wafer W may be within 4 mm.

An upper inner end portion 144b of the edge ring 140 may be provided to surround the wafer W. When viewed in a plan view, the upper inner end portion 144b may be spaced apart from the wafer W. An inner diameter of the upper inner end portion 144b may be greater than the outer diameter of the wafer W. A difference between the inner diameter of the upper inner end portion 144b and the outer diameter of the wafer W may be within 3 mm.

A baffle member 160 (see FIG. 1) may be disposed outside the outer peripheral surface of the support plate 110. The baffle member 160 may be disposed in the second inner space S2 between the middle portion of the cylindrical outer side wall 22 and the cylindrical inner side wall 24. The baffle member 160 may include a conductive material. The baffle member 160 may include a conductive ring having an inner diameter and an outer diameter. The baffle member 160 may include an annular plate extending parallel with the upper surface of the support plate 110. An upper surface of the baffle member 160 may be positioned lower than the upper surface of the wafer. The baffle member 160 may be disposed on or below the lower surface of the support plate 110.

The baffle member 160 may include a plurality of perforations through which gas passes. Process byproducts and residual process gases generated in the chamber 20 may be discharged through the exhaust port via the perforations of the baffle member 160.

In example embodiments, the substrate support apparatus may include a lift pin device having a plurality of lift pins 230 installed to be movable up and down inside the substrate stage 100 and supporting the shadow ring 200 that covers the edge region of the wafer W that is seated.

The shadow ring 200 may be supported on the substrate stage 100 around the wafer W so as to cover the edge region of the wafer W. The shadow ring 200 may be supported to be positioned on the outer insulating ring 130 and the edge ring 140 of the substrate stage 100. The shadow ring 200 may be supported by the plurality of lift pins 230 installed to be movable up and down inside the substrate stage 100. A drive mechanism of the lift pin device may independently elevate the plurality of lift pins 230. Accordingly, the shadow ring 200 may move above the substrate stage 100 within a predetermined stroke range.

As illustrated in FIGS. 3 and 4, the shadow ring 200 may have an annular shape. The shadow ring 200 may include a body portion 202, that may have an annular shape, and an inner end portion 220 provided in an inner perimeter of the body portion 202 to extend in a circumferential direction along the body portion 202 and having a beveled top surface 208. In addition, the shadow ring 200 may further include an outer end portion 224 in an outer perimeter of the body portion 202 to extend in a circumferential direction along the body portion 202.

The body portion 202 may have a bottom surface 204, that is annular, and a top surface 206 that is annular. The bottom surface 204 of the body portion 202 may be contacted and supported by the lift pins 230 on the outer insulating ring 130.

The shadow ring 200 may have a first recess 210 in the bottom surface 204 of the body portion 202 for receiving a protruding upper portion of the edge ring 140. A bottom surface 212 of the first recess 210 and the upper surface 142 of the edge ring 140 may be disposed to face each other.

Additionally, the shadow ring 200 may have a second recess 214 in the bottom surface 204 of the body portion 202 for receiving a protruding upper portion of the outer insulating ring 130. A lower surface 216 of the second recess 214 and the upper surface of the outer insulating ring 130 may be disposed to face each other. The second recess 214 may be arranged between the body portion 202 and the outer end portion 224.

The inner end portion 220 of the shadow ring 200 may extend toward the center of the shadow ring 200 to cover the edge region of the wafer W. When viewed in a plan view, a length L1 of the edge region of the wafer W covered by the shadow ring 200 may be up to 3 mm. For example, the length L1 of the edge region of the wafer W covered by the shadow ring 200 may be within a range of 1 mm to 3 mm.

A lower surface 226 of the outer end portion 224 of the shadow ring 200 may be coplanar with or lower than the bottom surface 204 of the body portion 202. A difference in height between the lower surface 226 of the outer end portion 224 and the bottom surface of the body portion 202 may be determined in consideration of flow conductance of the gas between the shadow ring 200 and the outer insulating ring 130 (the concept opposite to flow resistance), as will be described later.

An inner radius Rin of the inner end portion 220 of the shadow ring 200 may be smaller than a radius of the wafer W. An outer radius Rout of the outer end 222 of the shadow ring 200 may be equal to or greater than an outer diameter Dout of the substrate stage 100.

As illustrated in FIG. 6, the shadow ring 200 may move within a predetermined stroke on the substrate stage 100 by the plurality of lift pins 230. For example, the stroke, that is, a distance H2 between the shadow ring 200 and the surface of the wafer W may be within a range of 0.1 mm to 18 mm.

Hereinafter, a lift pin device of the shadow ring 200 will be described in detail.

Figure 7:
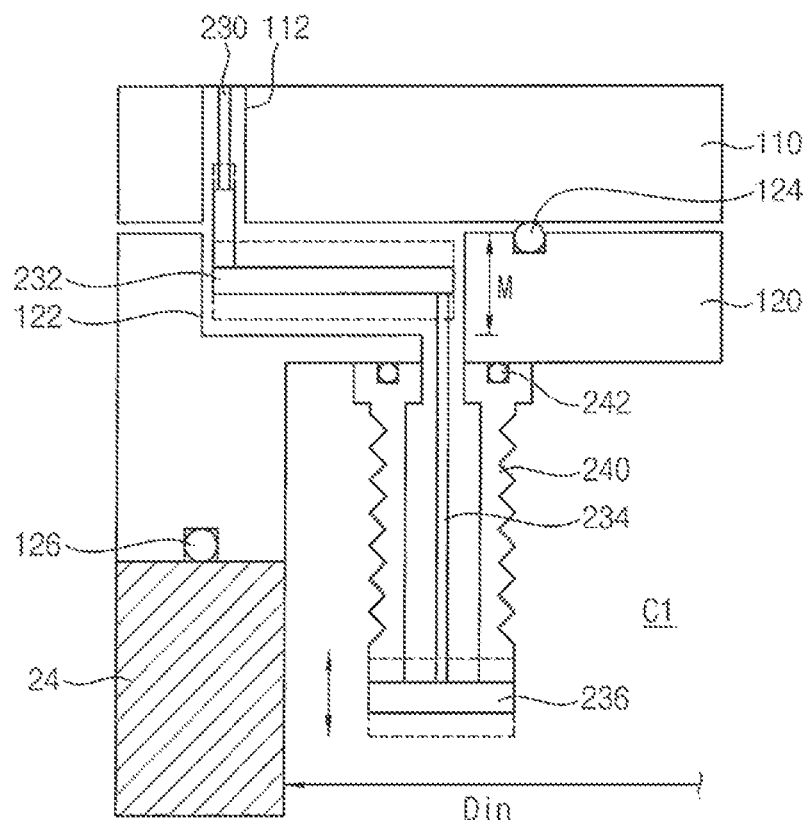
Figure 8:
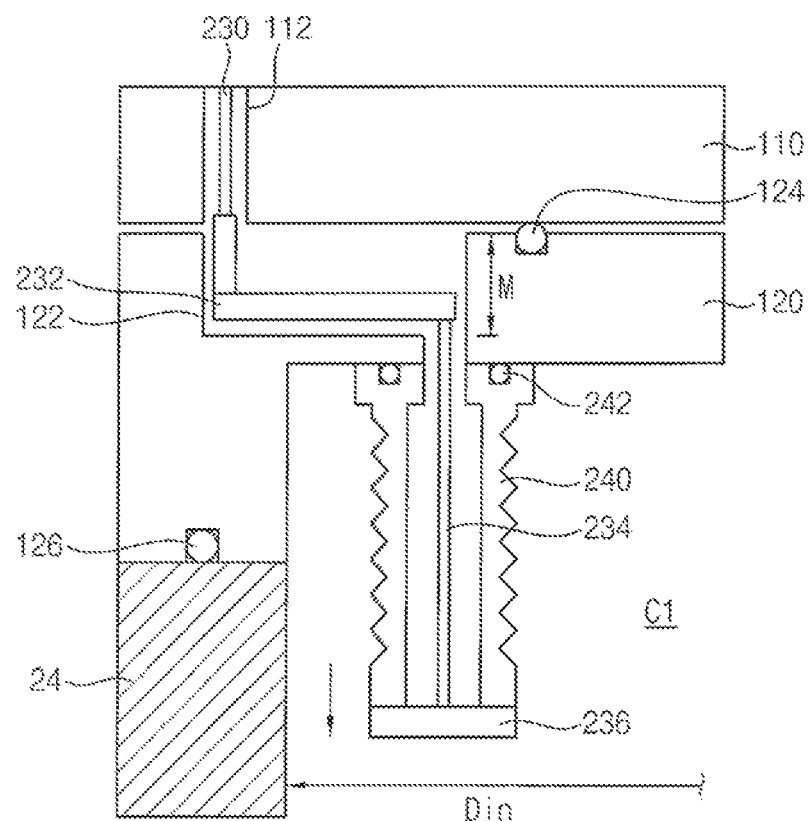
Figure 9:
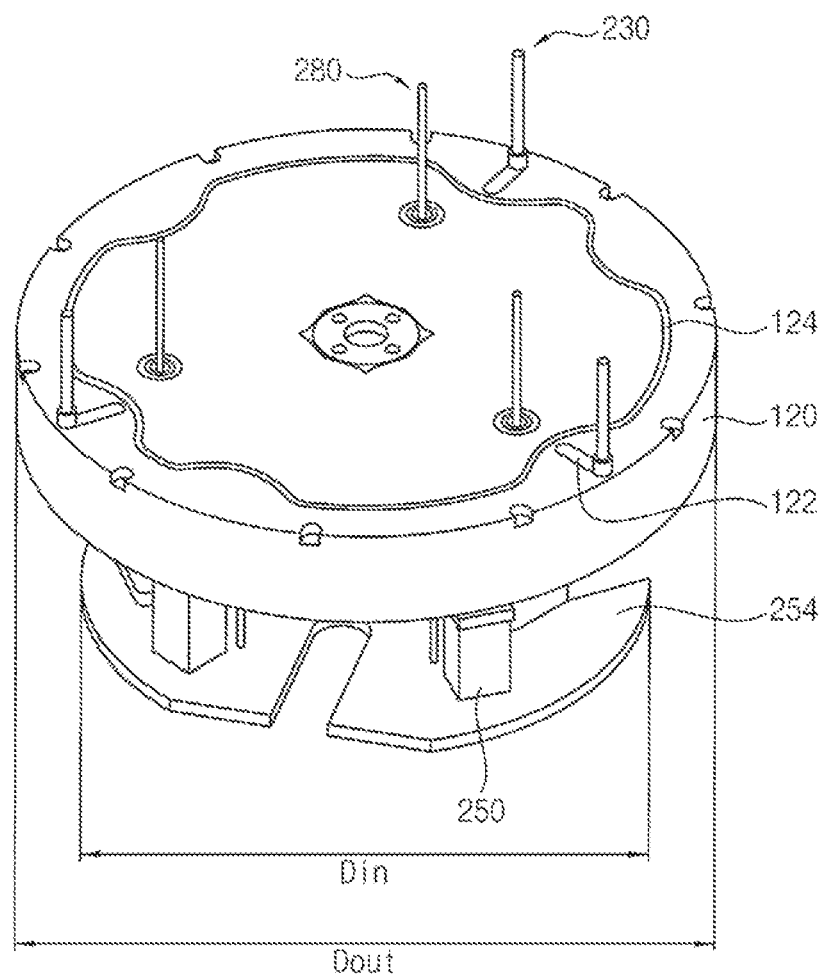
Figure 10:
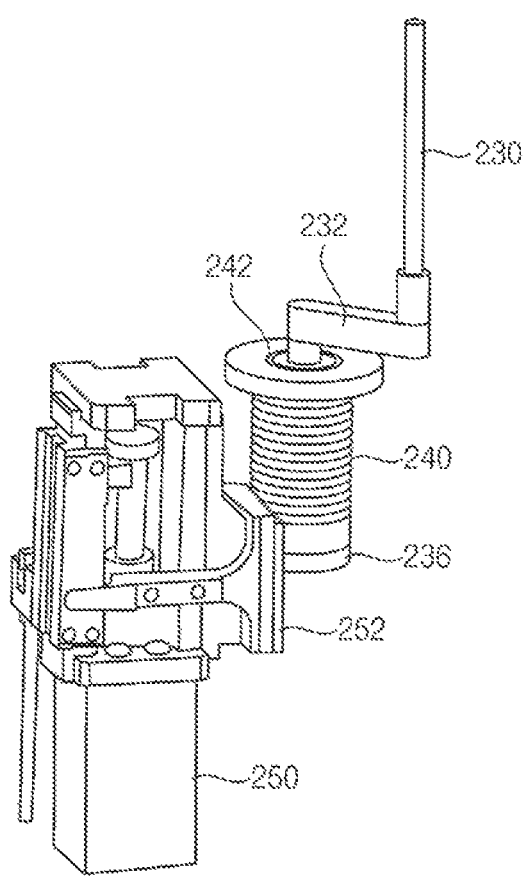
Figure 11:
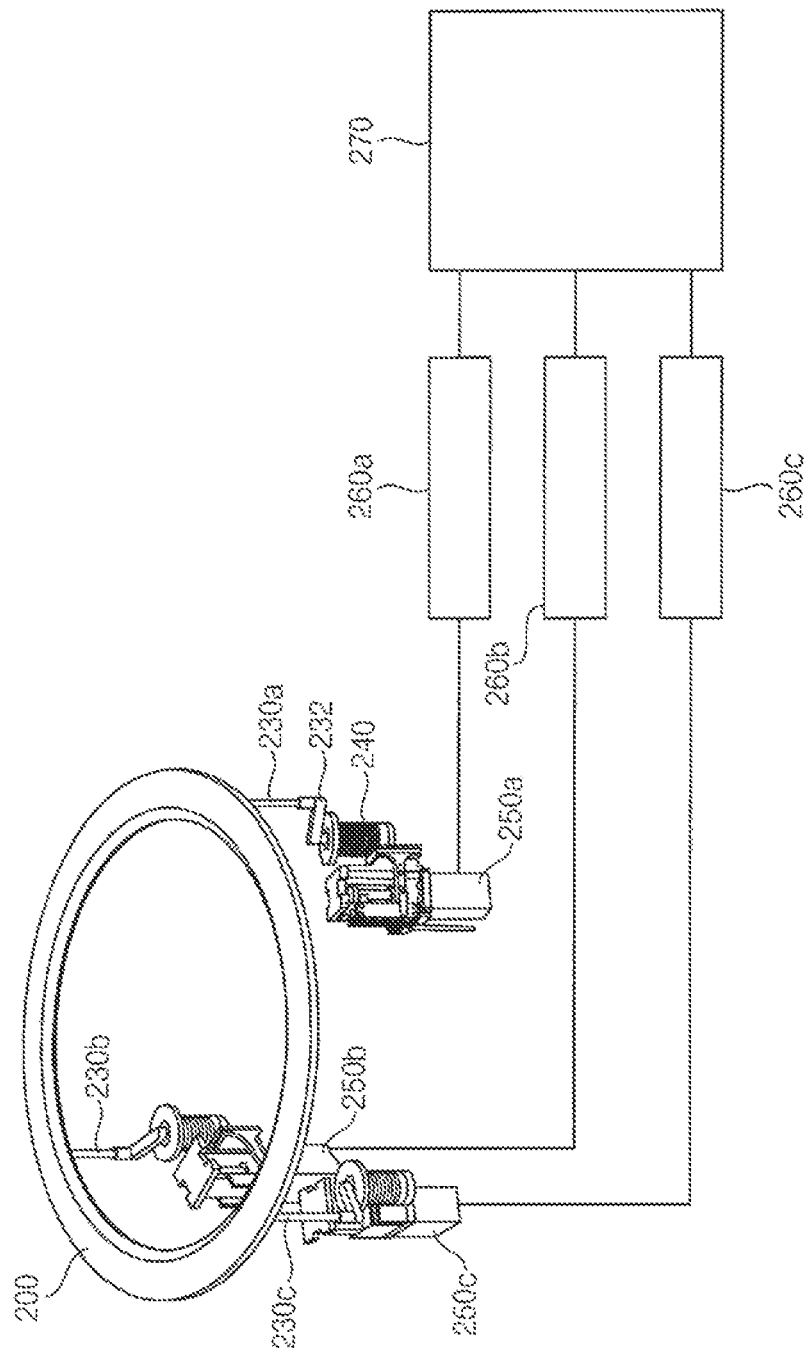

FIG. 7 is a cross-sectional view illustrating a portion of a lift pin device in accordance with example embodiments. FIG. 8 is a cross-sectional view illustrating a state in which a lift pin is lowered in FIG. 7. FIG. 9 is a perspective view illustrating a lower cover of a substrate stage in FIG. 1. FIG. 10 is a perspective view illustrating a drive motor of a lift pin in FIG. 7. FIG. 11 is a block diagram illustrating a controller coupled to a drive mechanism of lift pins in accordance with example embodiments. FIG. 7 is a cross-sectional view illustrating the portion 'B' in FIG. 1.

Referring to FIGS. 7 to 11, a shadow ring 200 may be supported on a substrate stage 100 around the wafer W to cover an edge region of a wafer W. The shadow ring 200 may be supported by a plurality of lift pins 230 that are installed to be movable up and down inside the substrate stage 100. A drive mechanism of the lift pin device may independently elevate the plurality of lift pins 230.

As illustrated in FIGS. 7 and 8, a lift pin assembly may include at least one of the lift pins 230, a connection pin 232 and a drive pin 234. In addition, the lift pin assembly may further include a pin drive plate 236 and a bellows 240.

The lift pin assembly may be mounted in a mounting hole of the substrate stage 100. The mounting hole may include a first pin hole 112 in a support plate 110, and a second pin hole 132 (refer to FIG. 3) in an outer insulating ring 130. The second pin hole 132 may be in communication with the first pin hole 112. The lift pins 230 may be installed to be movable in a vertical direction in the first pin hole 112 and the second pin hole 132. An upper end portion of at least one of the lift pins 230 may protrude through the second pin hole 132 of the outer insulating ring 130 to contact and support a lower surface 216 of the shadow ring 200.

A guide hole 122 may be formed in the lower cover 120 to be in communication with the first pin hole 112. The guide hole 122 may extend radially from the center of the lower cover 120. The guide hole 122 may extend in a thickness direction of the lower cover 120. A width of the guide hole 122 in the radial direction may be determined in consideration of a length of the connection pin 232. A width M of the guide hole 122 in the thickness direction may be determined in consideration of a stroke of one of the lift pins 230. Accordingly, the connection pin 232 may be accommodated in the guide hole 122 to be movable up and down.

The drive pin 234 may extend through the guide hole 122 to protrude from a lower surface of the lower cover 120. The drive pin 234 may extend in the vertical direction into a first accommodation space C1 under the lower cover 120. A lower end portion of the drive pin 234 may be fixed to the pin drive plate 236.

The bellows 240 may be configured to surround the drive pin 234 to isolate an inner space S1 of the chamber 20 and the first accommodation space C1 under the lower cover 120 from each other. An upper end portion of the bellows 240 may be fixed to the lower surface of the lower cover 120, and a lower end portion of the bellows 240 may be fixed to the pin drive plate 236. A sealing member such as an O-ring 242 may be mounted in a ring receiving groove formed in an upper surface of the bellows 240. The bellows 240 may be coupled to the lower cover 120 by the sealing member such as the O-ring 242. Accordingly, the bellows 240 may seal the inside of the chamber 20 from the outside while allowing free vertical movement of the drive pin 234.

In addition, a sealing member such as an O-ring 124 may be mounted in a ring receiving groove formed in an upper surface of the lower cover 120. Accordingly, the lower cover 120 may be coupled to the support plate 110 by the sealing member such as the O-ring 124 to seal the chamber 20. A vacuum may be generated in an outer region outside the O-ring 124 on the upper surface of the lower cover 120, and an inner region inside the O-ring 124 may be maintained at atmospheric pressure.

A sealing member such as an O-ring 126 may be mounted in a ring receiving groove formed in the lower surface of the lower cover 120. Accordingly, the lower cover 120 may be coupled to a cylindrical inner side wall 24 by the sealing member such as the O-ring 126 to seal the chamber 20.

Since a plurality of the connection pin 232 is disposed to extend radially from the center of the substrate stage 100, the lift pins 230 may be disposed radially farther from the center of the substrate stage 100 than the plurality of the drive pin 234. The lift pins 230 may be spaced apart from the center of the substrate stage 100 by a first radius, and the plurality of the drive pin 234 may be spaced apart from the center of the substrate stage 100 by a second radius smaller than the first radius.

For example, an outer diameter Dout of the substrate stage 100 may be about 380 mm, and a diameter Dpin of the position where the lift pins 230 are installed may be about 346 mm. A diameter Din of an inner surface of the cylindrical inner side wall 24 may be about 316 mm. The first accommodation space C1 may be defined by the inner surface of the cylindrical inner side wall 24. The outer diameter Dout of the substrate stage 100 may be equal to or greater than an outer diameter of the lower cover 120.

Accordingly, the drive mechanism including an actuator for raising and lowering at least one of the lift pins 230 may be disposed inside the first accommodating space C1 under the substrate stage 100 without protruding from the outer surface of the substrate stage 100.

Referring to FIGS. 9 and 10, the drive mechanism of the lift pin device may be disposed in the first accommodating space C1 under the substrate stage 100. The drive mechanism may include a drive motor 250 as an actuator for moving the lift pins 230 up and down. The drive motor 250 may raise and lower a sliding plate 252 through an appropriate gear drive. The pin drive plate 236 may be fixedly installed on the sliding plate 252. Accordingly, as the pin drive plate 236 slides due to driving of the drive motor 250, at least one of the lift pins 230 may rise and fall.

As illustrated in FIG. 11, the drive mechanism of the lift pin device may include a first actuator 250a, a second actuator 250b, and a third actuator 250c for moving a first lift pin 230a, a second lift pin 230b, and a third lift pin 230c up and down, respectively. The drive mechanism of the lift pin device may further include a first actuator driver 260a, a second actuator driver 260b, and a third actuator driver 260c for driving the first actuator 250a, the second actuator 250b, and the third actuator 250c, respectively. The first actuator 250a, the second actuator 250b, and the third actuator 250c may include a drive motor, and the first actuator driver 260a, the second actuator driver 260b, and the third actuator driver 260c may include a motor drive for driving the drive motor according to an input control signal. The first actuator driver 260a, the second actuator driver 260b, and the third actuator driver 260c may be connected to a controller 270 to independently control operations of the first lift pin 230a, the second lift pin 230b, and the third lift pin 230c.

The first actuator driver 260a, the second actuator driver 260b, and the third actuator driver 260c may independently raise and lower the first lift pin 230a, the second lift pin 230b, and the third lift pin 230c according to a lift pin control signal from the controller 270. The first actuator driver 260a may move the first lift pin 230a in the vertical direction (Z axis direction) by a first movement distance according to a first lift pin control signal from the controller 270. The second actuator driver 260b may move the second lift pin 230b in the vertical direction (Z axis direction) by a second movement distance according to a second lift pin control signal from the controller 270. The third actuator driver 260c may move the third lift pin 230c in the vertical direction (Z axis direction) by a third movement distance according to a third lift pin control signal from the controller 270.

The controller 270 may control operations of various components connected to the controller 270 to control the plasma processing apparatus 10. The controller 270 as a control module may include a processor, a memory, and one or more interfaces. The controller 270 may control the components connected to the controller 270 based on sensed values.

Hereinafter, a change in a height of the shadow ring according to operations of the lift pins in order to perform a plasma etching process will be explained.

Figure 12A:
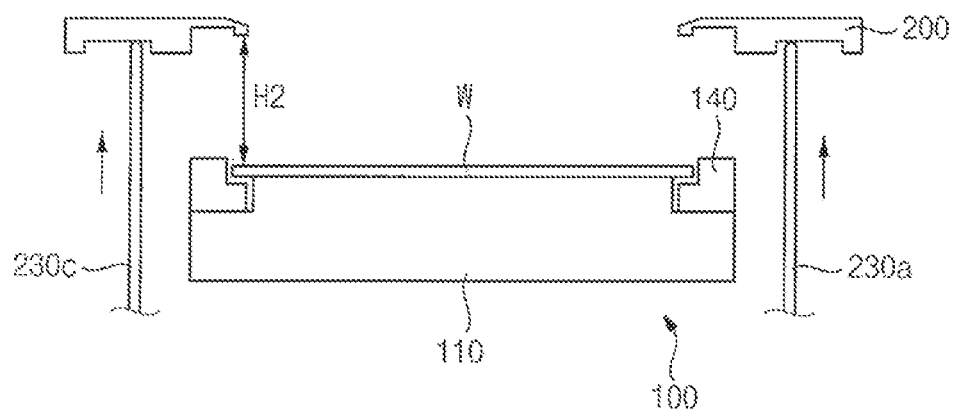
FIG. 12A is a first view for illustrating height changes of a shadow ring in accordance with example embodiments.
Figure 12B:
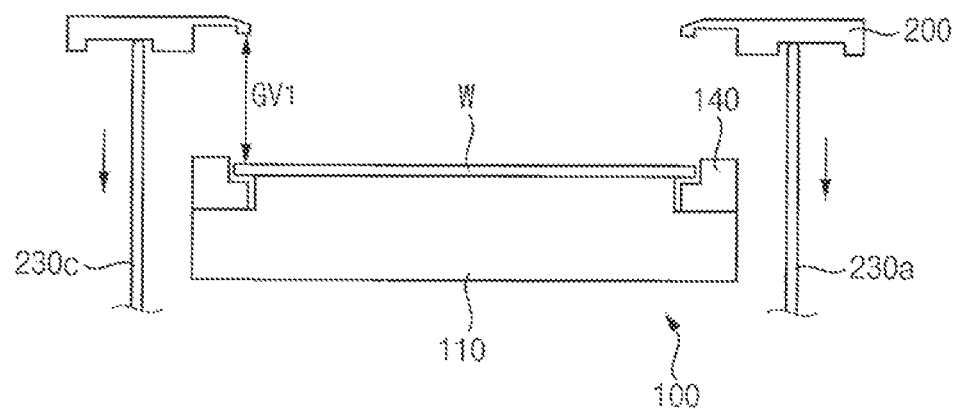
FIG. 12B is a second view for illustrating the height changes of the shadow ring in accordance with the example embodiments.
Figure 12C:
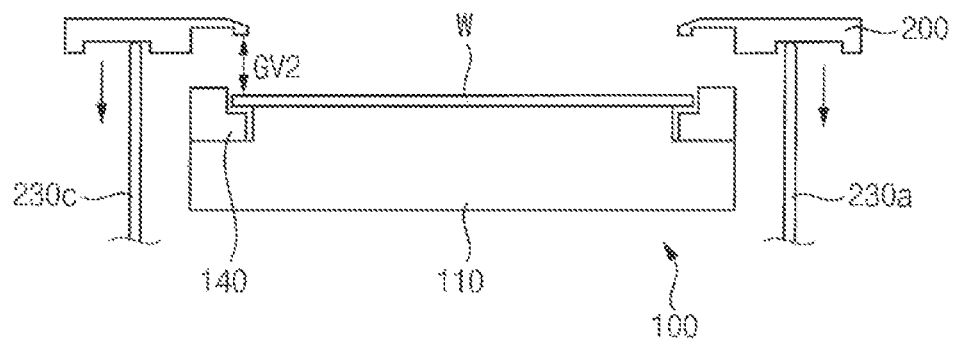
FIG. 12C is a third view for illustrating the height changes of the shadow ring in accordance with the example embodiments.
Figure 13:
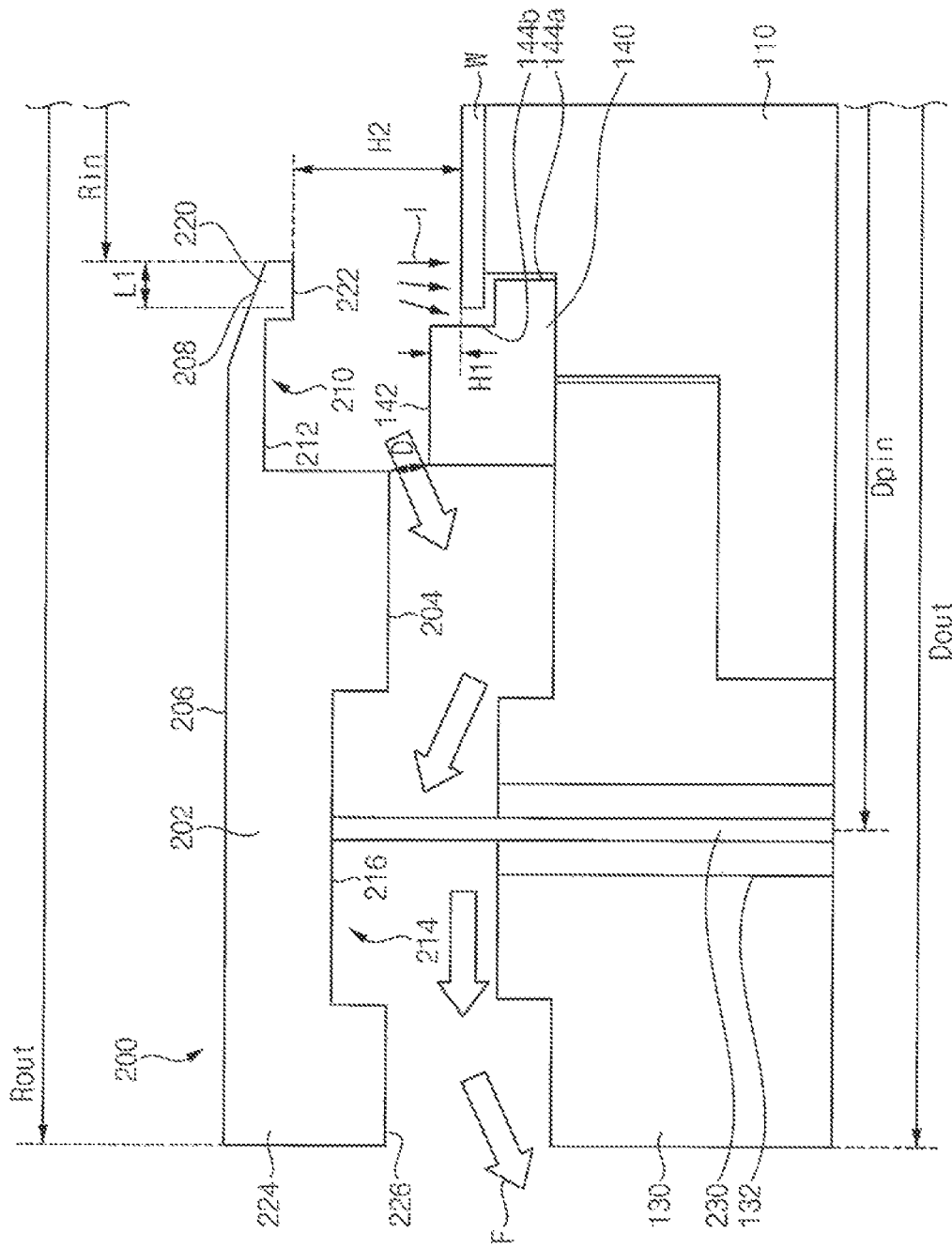

FIGS. 12A to 12C are views illustrating height changes of a shadow ring in accordance with example embodiments. FIG. 13 is a cross-sectional view illustrating a flow of gas flowing between the shadow ring and an underlying outer insulating ring and an underlying edge ring and directions of ions incident onto an edge region of a wafer.

Referring to FIGS. 12A to 12C, the first lift pin 230a, the second lift pin 230b, and the third lift pin 230c may be in contact with three points of the lower surface of the shadow ring 200 respectively to support the shadow ring 200.

First, as illustrated in FIG. 12A, in order to load or unload the wafer W onto or from the substrate stage 100, the first lift pin 230a, the second lift pin 230b, and the third lift pin 230c may be raised to raise the shadow ring 200 to maintain the shadow ring 200 at a predetermined height H2. When the shadow ring 200 is raised to the predetermined height H2, the wafer W may be seated on the substrate stage 100.

Then, as illustrated in FIGS. 12B and 12C, the heights of the first lift pin 230a, the second lift pin 230b, and the third lift pin 230c may be changed to adjust vertical distances GV1 and GV2 (also referred to as "gaps") between the wafer W and the shadow ring 200.

By adjusting the vertical distances GV1 and GV2 between the wafer W and the shadow ring 200, a flow rate of gas flowing outward from the center of the wafer W may be controlled. The vertical distance may be defined as a distance between a lower surface of an inner end portion of the shadow ring 200 and the wafer W.

As illustrated in FIG. 13, the shadow ring 200 may be spaced apart from the underlying outer insulating ring 130 and the underlying edge ring 140 by predetermined distances to form a flow path for gas flow therebetween. The gas F flowing outward from the center of the wafer W may be discharged from the chamber 20 through the flow path. The flow rate of the gas F may be a major factor in an etch profile. As the gas flow rate increases, an etch rate in the wafer edge region may increase.

In order to adjust a flow conductance in the flow path, the distance between the shadow ring 200 and the outer insulating ring 130 and the distance between the shadow ring 200 and the edge ring 140 may be adjusted. Shapes of the bottom surface of the shadow ring 200, the upper surfaces of the outer insulating ring 130 and the edge ring 140 may also be determined in consideration of the flow conductance.

In addition, since the upper surface 142 of the edge ring 140 is positioned higher than the upper surface of the wafer W, radicals to the edge region of the wafer W may be restricted, as well as the ion incident direction I on the edge surface of the wafer W may be formed to deviate from the wafer W, the amount of etching in the edge region of wafer W may be further reduced.

Figure 14:
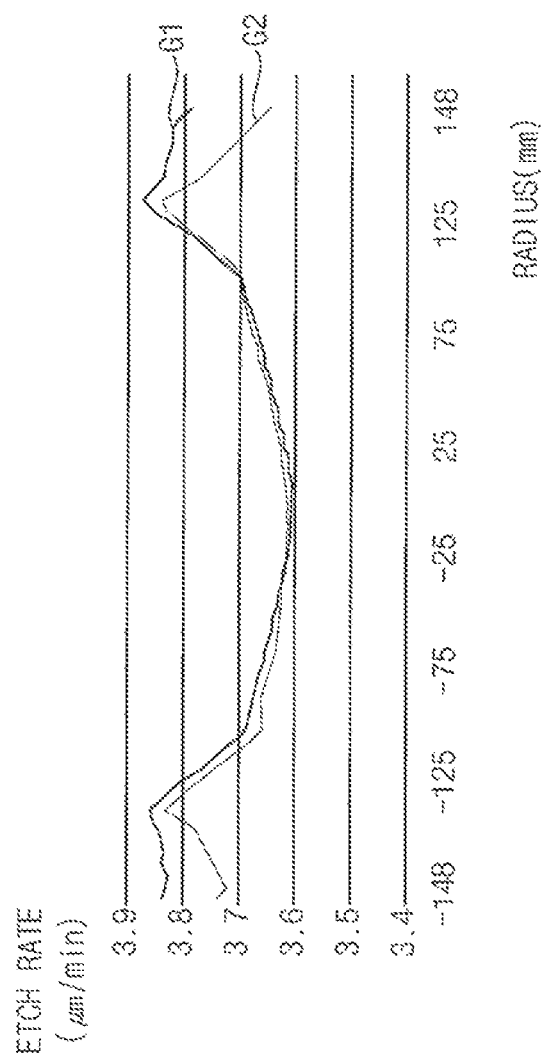

FIG. 14 is a graph showing an etch rate distribution according to a distance of a shadow ring with respect to a wafer surface.

Referring to FIG. 14, line G1 shows an etch rate distribution over a wafer radius when a shadow ring having a first gap GV1 with the wafer is used, and a line G2 shows an etch rate distribution over the wafer radius when the shadow ring with a second gap GV2 smaller than the first gap GV1 is used.

It can be seen that the etch rate in the edge region corresponding to the line G2 is relatively reduced compared to the etch rate in the edge region corresponding to the line G1. Accordingly, by adjusting a vertical spacing of the shadow ring, it may be possible to reduce the etch rate in the wafer edge region.

Hereinafter, a method of processing a substrate using the plasma processing apparatus of FIG. 1 will be explained.

FIG. 15 is a flow chart illustrating a substrate processing method in accordance with example embodiments. The substrate processing method may be used to perform a plasma etching process on a wafer bonded to a carrier wafer of a wafer support system (WSS) in a post process.

Referring to FIGS. 1 to 15, the shadow ring 200 may be disposed on the substrate stage 100 in the chamber 20 (S100), and the wafer W may be loaded on the substrate stage 100.

In example embodiments, after the wafer W on which semiconductor chips are formed is bonded onto a carrier wafer of a substrate support system WSS, the carrier wafer to which the wafer W is bonded may be loaded onto the substrate stage 100 (S200).

First, the shadow ring 200 may be disposed on the outer insulating ring 130 and the edge ring 140 of the substrate stage 100. The upper surface 142 of the edge ring 140 may have a first height H1 from the upper surface of the wafer W. For example, the first height H1 may be within a range of 3 mm to 10 mm. Since the upper surface 142 of the edge ring 140 is positioned higher than the upper surface of the wafer W, the ion incident direction on the edge surface of the wafer W is formed to face the outer direction of the wafer W to thereby reduce the amount of etching in the edge region of the wafer W.

Then, in order to avoid interference with the loaded wafer W, the first lift pin 230a, the second lift pin 230b, and the third lift pin 230c may be raised to support the shadow ring 200 at a predetermined height. The wafer W may be loaded on the electrostatic chuck of the substrate stage 100 through between the lift pins under the shadow ring 200.

Then, the spacing between the shadow ring 200 and the edge region of the wafer W may be adjusted (S300), and a plasma etching process may be performed in the chamber 20 (S400).

In example embodiments, the drive mechanism may move the first lift pin 230a, the second lift pin 230b, and the third lift pin 230c downward to adjust the spacing of the shadow ring 200 with respect to the surface of the wafer W. That is, the vertical distance between the wafer W and the shadow ring 200 may be adjusted. By adjusting the distance between the shadow ring 200 and the outer insulating ring 130, and between the shadow ring 200 and the edge ring 140, the flow conductance in the flow path therebetween may be adjusted.

Then, a process gas may be supplied to the wafer W to perform the plasma etching process in the chamber 20.

In particular, etching process gases may be supplied into the chamber 20 through the shower head 50. Plasma power may be applied to the upper electrode 40 as a plasma electrode to form plasma, and a bias power may be applied to the lower electrode 30 to perform the plasma etching process in the chamber 20.

During the plasma etching process, the shadow ring 200 may be supported to have a predetermined height by the first lift pin 230a, the second lift pin 230b, and the third lift pin 230c, and the lower surface of the shadow ring 200 may be spaced apart from the upper surfaces of the outer insulating ring 130 and the edge ring 140 on the substrate stage 100.

The gap between the shadow ring 200 and the wafer W, the gap between the shadow ring 200 and the outer insulating ring 130, and the gap between the shadow ring 200 and the edge ring 140 may affect the etch rate in the edge region with respect to the RF characteristics and flow of the process gas. By adjusting the spacing of the shadow ring 200, it may be possible to actively cope with changes due to process changes in the post process.

The above substrate processing apparatus may be may be used to manufacture semiconductor devices including logic devices and memory devices. For example, the semiconductor devices may include logic devices such as central processing units (CPUs), main processing units (MPUs), or application processors (APs), or the like, and volatile memory devices such as dynamic random-access memory (DRAM) devices, high bandwidth memory (HBM) devices, or non-volatile memory devices such as flash memory devices, parallel random-access memory (PRAM) devices, magnetoresistive random-access memory (MRAM) devices, resistive random-access memory (ReRAM) devices, or the like.

The foregoing is illustrative of non-limiting example embodiments and is not to be construed as limiting the present disclosure. Although a few example embodiments have been described, those skilled in the art will readily appreciate that many modifications are possible in example embodiments without materially departing from the novel teachings and advantages of the present disclosure. Accordingly, all such modifications are intended to be included within the scope of the present disclosure.

What is claimed is:

1. A substrate support apparatus, comprising:
    a substrate stage configured to have a wafer seated thereon; and
    a ring assembly configured to control plasma in an edge region of the wafer,
    wherein the ring assembly comprising:
        an outer insulating ring around an upper outer periphery of the substrate stage;
        an edge ring around the substrate stage, and on the outer insulating ring; and
        a shadow ring configured to move up and down within a predetermined stroke range above the outer insulating ring and the edge ring, the shadow ring configured to cover the edge region of the wafer while the wafer is seated on the substrate stage,
    wherein an upper surface of the edge ring is located higher than an upper surface of the substrate stage by a predetermined height, and
    wherein the shadow ring comprises:
        a body portion comprising an annular shape; and
        a recess in a bottom surface of the body portion, the recess configured to accommodate at least a portion of a protruding upper portion of the edge ring.

2. The substrate support apparatus of claim 1, wherein the wafer is seated on the substrate stage, and a predetermined height of the upper surface of the edge ring, above an upper surface of the wafer, is within a range of 3 mm to 10 mm.

3. The substrate support apparatus of claim 1, wherein the wafer is seated on the substrate stage, and a length of the edge region of the wafer covered by the shadow ring is within a range of 1 mm to 3 mm.

4. The substrate support apparatus of claim 1, wherein the wafer is seated on the substrate stage, and a distance between the shadow ring and an upper surface of the wafer is within a range of 0.1 mm to 18 mm.

5. The substrate support apparatus of claim 1, further comprising:
    lift pins configured to move up and down within the substrate stage, and configured to contact and support at least two points of a lower surface of the shadow ring; and
    a drive mechanism configured to independently drive the lift pins to adjust a vertical spacing between the wafer and the shadow ring.

6. The substrate support apparatus of claim 5, wherein the drive mechanism comprises:
    actuators configured to move the lift pins up and down, respectively; and
    actuator drivers configured to drive the actuators according to input control signals, respectively.

7. The substrate support apparatus of claim 5, wherein the lift pins comprise a first lift pin, a second lift pin, and a third lift pin that contact and support three points on the lower surface of the shadow ring, respectively.

8. The substrate support apparatus of claim 7, wherein the drive mechanism is configured to adjust a vertical spacing of the shadow ring with respect to an upper surface of the wafer by adjusting heights of the first lift pin, the second lift pin, and the third lift pin.

9. The substrate support apparatus of claim 5, further comprising:
    a connection pin connected to an end portion of one of the lift pins and extending in a radial direction toward a center of the substrate stage; and
    a drive pin extending from an end portion of the connection pin in a direction parallel with an extending direction of the one of the lift pins,
    wherein the drive mechanism is configured to raise and lower the drive pin.

10. A substrate support apparatus, comprising:
    a substrate stage configured to have a wafer seated thereon;
    an outer insulating ring on an upper outer periphery of the substrate stage;
    an edge ring on the outer insulating ring, around the substrate stage; and
    a shadow ring above the outer insulating ring and the edge ring, the shadow ring configured to move up and down within a predetermined stroke range and to cover an edge region of the wafer while the wafer is seated on the substrate stage, wherein an upper surface of the edge ring is located higher than an upper surface of the substrate stage by a predetermined height, wherein the shadow ring comprises:
- an annular body portion;
- an inner end portion extending around an inner circumference of the annular body portion and extending toward a center of the shadow ring, such as to be configured to cover the edge region of the wafer;
- an outer end portion extending around an outer circumference of the annular body portion; and
- a recess in a bottom surface of the annular body portion, at least a portion of a protruding upper portion of the edge ring received in the recess, and wherein the shadow ring is configured to move up and down such as to be spaced apart from the outer insulating ring and the edge ring by respective predetermined distances to form a flow path for gas flow between the shadow ring and the outer insulating ring and between the shadow ring and the edge ring.

11. The substrate support apparatus of claim 10, wherein the wafer is seated on the substrate stage, and a length of the edge region of the wafer covered by the inner end portion is within a range of 1 mm to 3 mm.

12. The substrate support apparatus of claim 10, wherein the shadow ring further includes a second recess that is provided in the bottom surface of the annular body portion, the second recess accommodating a protruding upper portion of the outer insulating ring.

13. The substrate support apparatus of claim 12, wherein the second recess is arranged between the annular body portion and the outer end portion.

14. The substrate support apparatus of claim 10, wherein a lower surface of the outer end portion is located on a plane that is the same as or lower than a plane on which the bottom surface of the annular body portion is located.

15. The substrate support apparatus of claim 10, wherein an outer radius of the outer end portion of the shadow ring is equal to or greater than an outer diameter of the substrate stage.

16. The substrate support apparatus claim 10, wherein the wafer is seated on the substrate stage, and a distance between the shadow ring and an upper surface of the wafer is within a range of 0.1 mm to 18 mm.

17. The substrate support apparatus of claim 10, wherein the wafer is seated on the substrate stage, and a predetermined height of the upper surface of the edge ring, above an upper surface of the wafer, is within a range of 3 mm to 10 mm.

18. The substrate support apparatus of claim 10, further comprising:
- lift pins configured to be move up and down within the substrate stage, and configured to contact and support at least two points of a lower surface of the shadow ring; and
- a drive mechanism configured to independently drive the lift pins to adjust a vertical spacing between the wafer and the shadow ring.

19. The substrate support apparatus of claim 18, wherein the drive mechanism comprises:
- actuators configured to move the lift pins up and down, respectively; and
- actuator drivers configured to drive the actuators according to input control signals, respectively.

20. A substrate support apparatus, comprising:
- a substrate stage disposed within a chamber that comprises a space for processing a wafer, the substrate stage configured to have the wafer seated thereon;
- a substrate electrode in the substrate stage and to which a source power is applied;
- an outer insulating ring around an upper outer periphery of the substrate stage;
- an edge ring around the substrate stage and on the outer insulating ring; and
- a shadow ring configured to move up and down within a predetermined stroke range above the outer insulating ring and the edge ring, the shadow ring configured to cover an edge region of the wafer while the wafer is seated on the substrate stage, wherein an upper surface of the edge ring is located higher than an upper surface of the substrate stage by a predetermined height, and wherein the shadow ring comprises:
- a body portion comprising an annular shape; and
- a recess in a bottom surface of the body portion, the recess accommodating at least a portion of a protruding upper portion of the edge ring.

* * * * *